(12) United States Patent
Morimoto

(10) Patent No.: US 7,279,776 B2
(45) Date of Patent: Oct. 9, 2007

(54) METHOD OF MANUFACTURING SEMICONDUCTOR DEVICE AND SEMICONDUCTOR DEVICE

(75) Inventor: Hiroyuki Morimoto, Tsukuba (JP)

(73) Assignee: Canon Kabushiki Kaisha, Tokyo (JP)

( * ) Notice: Subject to any disclaimer, the term of this patent is extended or adjusted under 35 U.S.C. 154(b) by 241 days.

(21) Appl. No.: 11/134,427

(22) Filed: May 23, 2005

(65) Prior Publication Data

US 2005/0266687 A1 Dec. 1, 2005

(30) Foreign Application Priority Data

May 25, 2004 (JP) ............................. 2004-154836
May 13, 2005 (JP) ............................. 2005-141086

(51) Int. Cl.
*H01L 23/48* (2006.01)
*H01L 23/52* (2006.01)
*H01L 29/40* (2006.01)
*B23K 26/00* (2006.01)

(52) U.S. Cl. ............... 257/621; 257/774; 257/E23.067; 257/E21.597; 438/667

(58) Field of Classification Search ................ 257/621, 257/622, 774, 775, E29.004, E23.011, E23.067, 257/E21.578, E21.597; 438/701, 667
See application file for complete search history.

(56) References Cited

U.S. PATENT DOCUMENTS 4,961,821 A * 10/1990 Drake et al. .................. 438/21
6,563,079 B1    5/2003 Umetsu et al. ........ 219/121.71
6,667,551 B2 * 12/2003 Hanaoka et al. ............ 257/750
6,720,661 B2 *  4/2004 Hanaoka et al. ............ 257/774
6,852,621 B2 *  2/2005 Hanaoka et al. ............ 438/638
2002/0151171 A1 * 10/2002 Furusawa .................... 438/660
2005/0266687 A1   12/2005 Morimoto ................... 438/667
2006/0040494 A1 *  2/2006 Hiatt .......................... 438/667

FOREIGN PATENT DOCUMENTS

JP          2002-210614    *  7/2002

* cited by examiner

*Primary Examiner*—M. Wilczewski
(74) *Attorney, Agent, or Firm*—Fitzpatrick, Cella, Harper & Scinto

(57) ABSTRACT

A silicon substrate has a protective film formed on each side. A semiconductor surface opening not smaller than a given region is formed by removing the protective film. A through-hole having an inner size smaller than the given region is formed in the opening by laser machining. Thereafter, the inner size of the through-hole is increased by anisotropic etching, and the etching is ended when the inner size of the through-hole reaches the given size. In this way, a through-hole of a given size can be formed without allowing reversely tapered crystal planes to appear from a surface of the substrate toward the inside of the through-hole.

3 Claims, 9 Drawing Sheets

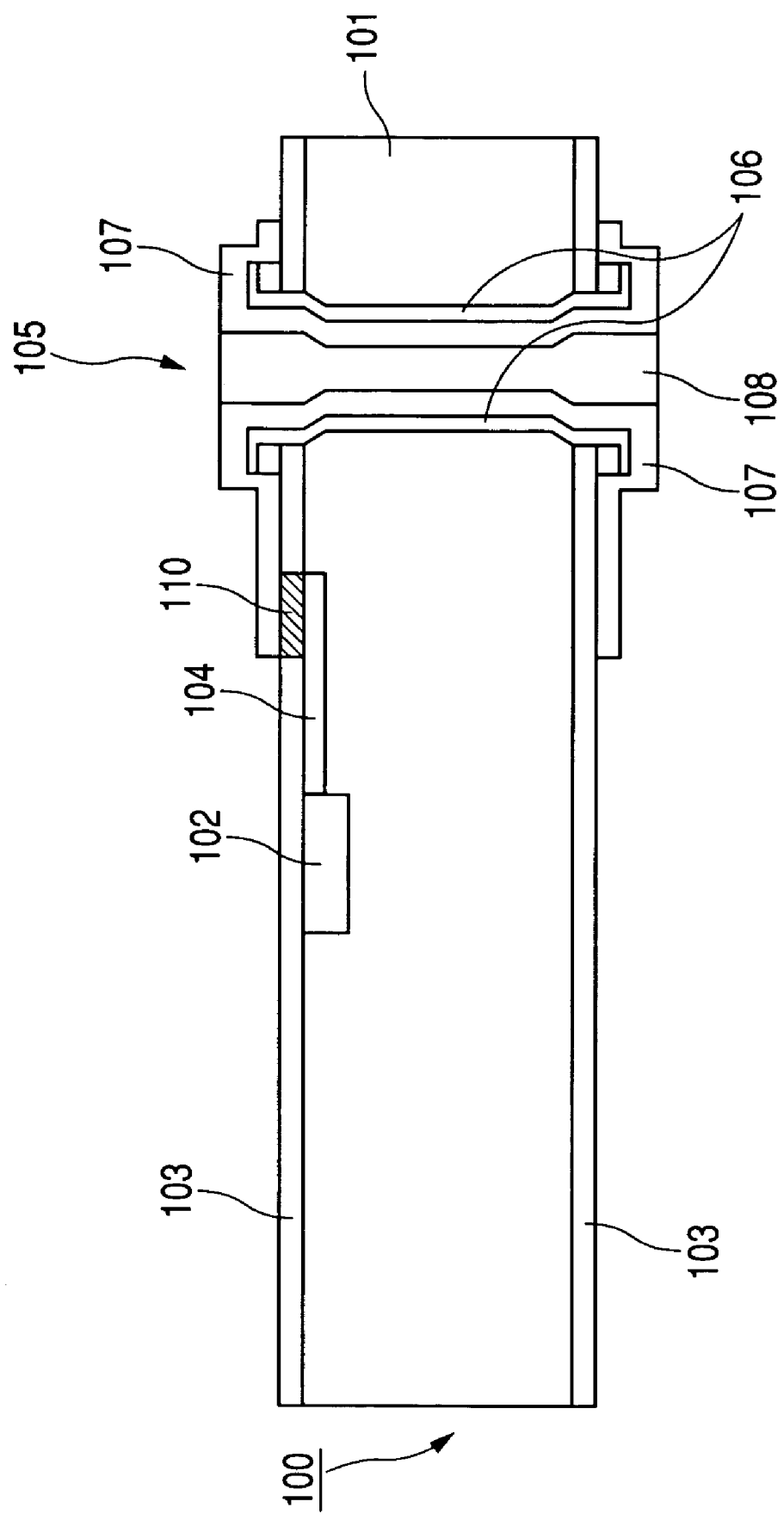

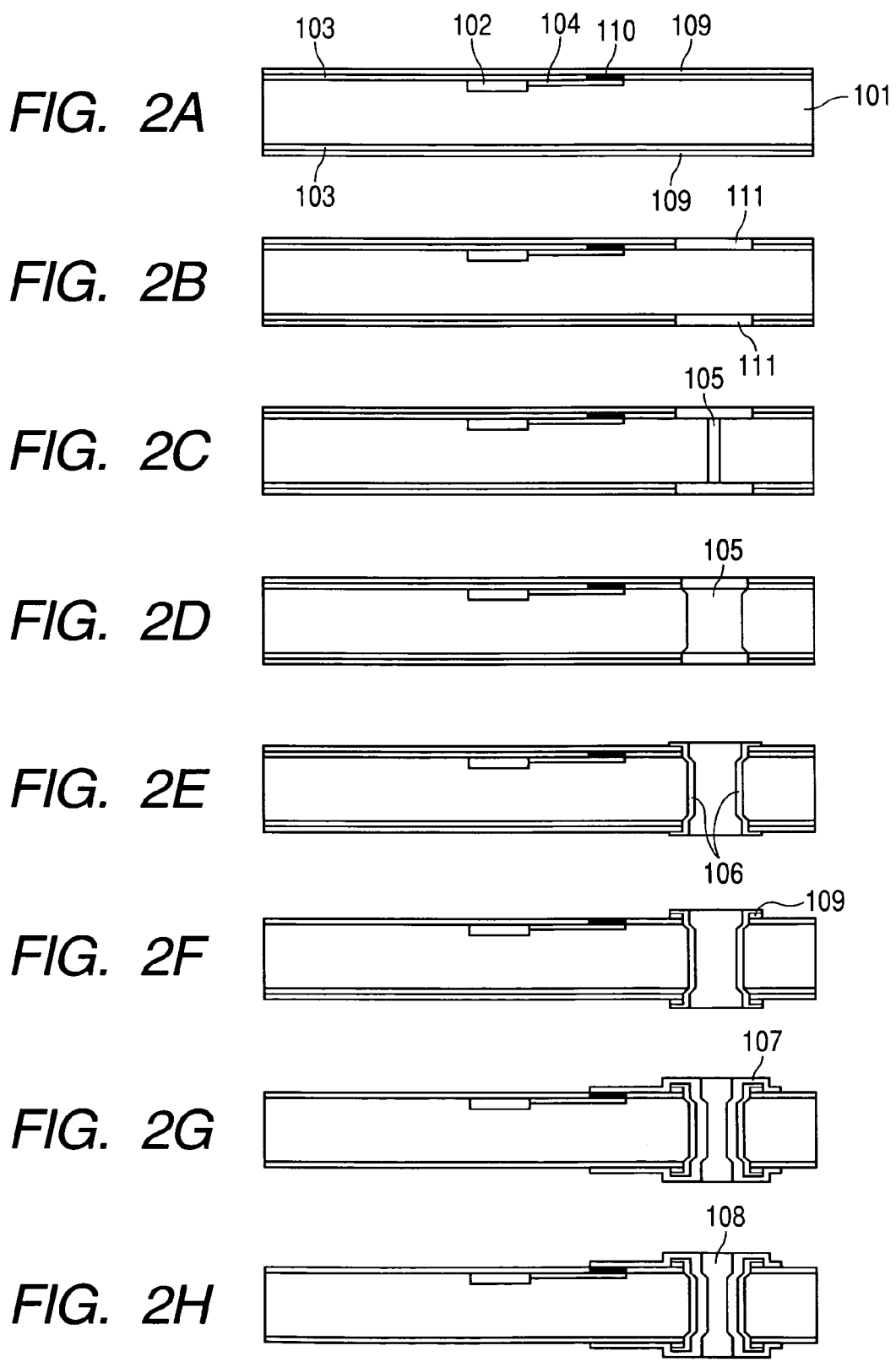

METHOD OF MANUFACTURING SEMICONDUCTOR DEVICE AND SEMICONDUCTOR DEVICE

BACKGROUND OF THE INVENTION

1. Field of the Invention

The present invention relates to a method of manufacturing a semiconductor device with a semiconductor substrate. More specifically, the present invention relates to a method of manufacturing a semiconductor device in which a through-hole is formed in a semiconductor substrate to thereby establish electrical conduction between a front surface and rear surface of the semiconductor substrate.

2. Related Background Art

Plural active elements are formed on a surface of a semiconductor substrate in conventional electrophotographic apparatuses, optical recording apparatuses, ink jet printer heads, and other semiconductor apparatuses that are made by a semiconductor process. These active elements are electrically connected to each other to thereby give the semiconductor apparatus various functions in compact forms. The recent downsizing of electronic equipment is accompanied by a demand for further reduction in size and increase in density of semiconductor apparatuses. A possible solution under consideration is to electrically connect the front surface and rear surface of a semiconductor substrate via a through-hole formed in the semiconductor substrate, so that the rear surface of the semiconductor substrate, in addition to the front surface, is put into use as a wiring region.

One of the methods to form a through-hole in a semiconductor substrate is laser machining. U.S. Pat. No. 6,563,079 B describes how through-hole formed by laser machining is utilized to electrically connect the front surface and rear surface of a semiconductor substrate. In U.S. Pat. No. 6,563,079 B, the first step is to form, with a laser, a through-hole in a silicon substrate that has a {100} crystal plane orientation on the front and rear surfaces. The inner size of the through-hole is then increased by wet anisotropic etching. Next, an insulating film is formed on the inner surface of the through-hole by chemical vapor deposition (CVD), physical vapor deposition (PVD), or the like. On the surface of the insulating film, a conductive film is formed by sputtering, plating, patterning, etching, or the like. A semiconductor substrate whose front surface and rear surface are electrically connected via a conductive film in the through-hole is thus manufactured.

However, the method of forming a through-hole by laser machining and then increasing its inner size by etching, as the one shown in U.S. Pat. No. 6,563,079 B, has several problems. The problems originate from the fact that the etching rate in wet anisotropic etching of a semiconductor substrate greatly varies from one crystal orientation to another.

Table 1 shows the etching rate of a silicon substrate when the substrate has {100}, {110} and {111} crystal plane orientations.

TABLE 1

| | Silicon substrate etching rate |
|---|---|
| {100} | 0.60 |
| {110} | 1.11 |
| {111} | 0.02 |

TABLE 1-continued

| Silicon substrate etching rate |
|---|
| Etching conditions |
| 20% aqueous solution of TMAH |
| Temperature: 80° C. |

First, a description is given on a case in which a laser is used to form a through-hole in a silicon substrate that has a {110} crystal plane orientation on the front and rear surfaces and the hole size of the through-hole is enlarged by wet anisotropic etching. In the case of a silicon substrate that has a {110} crystal plane orientation on the front and rear surfaces, the inner size of a through-hole formed by laser machining is increased in a direction where the crystal orientation is {111}. From Table 1, it is understood that a {111} plane silicon substrate is etched at a rate far slower than a {100} silicon substrate and a {110} plane silicon substrate. In the case of a silicon substrate that has a {110} crystal plane orientation on the front and rear surfaces, the inner size of a through-hole formed by laser machining is increased in a direction where the crystal orientation is a {110} crystal plane, and the etching rate of the through-hole is very slow. Accordingly, industrially speaking, it is not preferable to use a silicon substrate that has a {110} crystal plane orientation on the front and rear surfaces in the method of forming a through-hole and then increasing its inner size by etching.

A case of using a silicon substrate that has a {100} crystal plane orientation on the front and rear surfaces is described next. FIGS. 8A and 8B show the positional relation between a {111} crystal plane, a {100} crystal plane and a {110} crystal plane in a {100} silicon substrate. FIG. 8A is a perspective view showing the positional relation between the three crystal planes in the {100} silicon substrate, and FIG. 8B is a sectional view cut along the {110} crystal plane. As can be seen in FIGS. 8A and 8B, the {100} crystal plane and the {110} crystal plane are at right angles with each other whereas the {111} crystal plane is at about 54.7° with respect to the {100} crystal plane.

FIGS. 9A and 9B are schematic diagrams showing the state of a through-hole which is formed by a laser in a silicon substrate having a {100} crystal plane orientation on the front and rear surfaces and which is enlarged in size by wet anisotropic etching. FIG. 9A is a sectional view of the semiconductor substrate and FIG. 9B is a top view of the semiconductor substrate. FIG. 9A only shows the vicinity of the through-hole on the front surface of the semiconductor substrate, but the rear surface of the semiconductor substrate is in a similar state. The dotted lines in FIG. 9A represent the through-hole after it is formed by laser machining and before its inner size is increased by etching.

In FIGS. 9A and 9B, a reference symbol 1 denotes a semiconductor substrate made of silicon, 3 denotes a protective film formed from a thermally oxidized film and having an insulating ability, and 5 denotes a through-hole. Laser machining is performed after the protective film 3 is formed on each side of the semiconductor substrate 1, and therefore the inner circle (indicated by the dotted lines) of the through-hole formed by laser machining matches the opening in the protective film 3 in shape. When the silicon substrate has a {100} crystal plane orientation on the front and rear surfaces, the inner size of the through-hole formed by laser machining is increased in a direction where the crystal orientation is {110}. This means that the through-hole is etched easily at a fast etching rate.

On the other hand, the substrate is hardly etched in a direction where the crystal orientation is {111}. The {111} crystal plane forms, as shown in FIGS. 9A and 9B, an angle of about 54.7° with the {100} crystal plane on the front and rear surfaces of the silicon substrate. An increase in inner size of the through-hole 5, by anisotropic etching therefore gives the through-hole in the vicinity of the opening an edged shape (reversely tapered shape) at an angle of about 54.7° as shown in FIGS. 9A and 9B. The reversely tapered shape is enlarged as the anisotropic etching progresses.

In the case of the through-hole 5 shown in FIGS. 9A and 9B, the hole size is larger inside the hole than at its openings on the front surface and rear surface of the semiconductor substrate 1. This makes it difficult to form on the inner surface of the through-hole a uniform insulating film or conductive film by CVD, PVD or the like. Specifically, in CVD or the like, the reversely tapered shape of the through-hole in which the inner size is small at the openings and becomes larger toward the middle of the hole hinders vapor circulation in the through-hole and thus lowers the deposition efficiency. In PVD such as sputtering, the reversely tapered shape could prevent metal atoms, which linearly travel from the entrances of the through-hole to the inside of the through-hole, from reaching the inner surface of the through-hole geometrically. The resultant insulating film or conductive film does not have a necessary thickness, and causes defective insulation or defective conduction.

Forming the conductive film by plating is also unsuccessful in giving the conductive film a necessary thickness and avoiding defective conduction since the reversely tapered shape detains a plating solution inside the through-hole 5 and prevents the plating liquid from circulating back to the outside of the through-hole, thus lowering the speed of plating the inner surface of the through-hole.

The semiconductor substrate 1 forms a semiconductor pattern after the through-hole 5 is formed. The formation of the semiconductor pattern includes application of a resist material by spin coating or the like, and therefore it is desirable to seal the interior of the through-hole 5 completely with a sealing material. A conceivable sealing measure is injection utilizing printing, a dispenser, a difference in air pressure, or the like. Here the reversely tapered openings of the through-hole 5 pose another problem. With the reversely tapered openings, filling the through-hole 5 completely with a sealing material by injection is difficult and there is a strong possibility that air bubbles are left in the interior of the through-hole 5.

As shown in FIG. 9A, the thermally oxidized film 3 formed to a thickness of about 1 μm on the semiconductor substrate 1 also has a function of an etching stopper layer. As the inner size of the through-hole 5 in the semiconductor substrate 1 is increased by etching, a hood portion 3a is formed in the thermally oxidized layer 3 as an etching stopper layer. The hood portion 3a is easily broken at a small pressure, presenting a serious problem for the reliability of the step.

SUMMARY OF THE INVENTION

An object of the present invention is to efficiently form a through-hole perpendicular to a semiconductor substrate without giving the through-hole a reversely tapered shape around its openings even in the case where the inner size of the through-hole is increased after the through-hole is opened in the semiconductor substrate with a laser.

In order to attain the above object, the present invention provides a method of manufacturing a semiconductor device with a through-hole of a given size formed in a semiconductor substrate which includes: preparing a semiconductor substrate having a surface of a {100} crystal plane orientation and having a protective film formed on the front surface and the rear surface each; removing the protective film from a region larger than the given size to form a protective-film-removed portion on each of the front surface and rear surface of the semiconductor substrate; irradiating the protective-film-removed portion with a laser to form a through-hole having an inner size smaller than the given size; increasing the inner size of the through-hole by anisotropic etching, ending the etching when the inner size of the through-hole reaches the given size; and forming an insulating layer and then a conductive layer inside the through-hole to electrically connect the front surface and rear surface of the semiconductor substrate.

The present invention also provides a semiconductor device with its front surface and rear surface electrically connected which is constructed of a protective film formed on each of the front surface and rear surface of a semiconductor substrate having a surface of a {100} crystal plane orientation, a protective-film-removed portion obtained by removing the protective film from a region of a given size on each of the front surface and rear surface of the semiconductor substrate, and a through-hole formed within the protective-film-removed portion, and in which the protective-film-removed portion of the through-hole is tapered from the protective-film-removed portion toward the inside of the through-hole, a conductive layer is formed in the through-hole through an insulating layer, and the conductive layer electrically connects the front surface and rear surface of the semiconductor substrate.

The above and other objects, features, and advantages of the invention will become more apparent from the following detailed description taken in conjunction with the accompanying drawings.

BRIEF DESCRIPTION OF THE DRAWINGS

FIG. 1 is a sectional view of a semiconductor device according to an embodiment mode of the present invention;

FIGS. 2A, 2B, 2C, 2D, 2E, 2F, 2G and 2H are sectional views showing a semiconductor device manufacturing process according to a first embodiment;

DESCRIPTION OF THE PREFERRED EMBODIMENTS

Figure 3A:
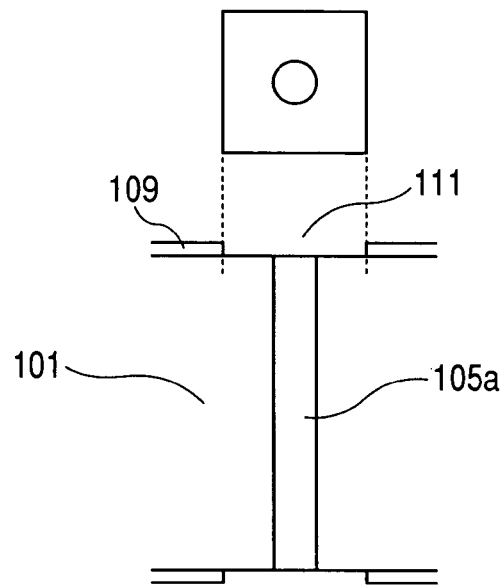
FIGS. 3A, 3B, 3C and 3D are sectional views showing how the shape of a through-hole changes as anisotropic etching progresses.

A preferred embodiment mode of the present invention is described next with reference to the accompanying drawings.

FIG. 1 is a sectional view of a semiconductor device according to a first embodiment of the present invention. In FIG. 1, a reference symbol 100 denotes the semiconductor device and 101 denotes a silicon substrate that has a surface of a {100} crystal plane orientation (hereinafter referred to as {100} silicon substrate). Denoted by 102 is an active element formed on the {100} silicon substrate 101. The active element 102 is incorporated in the silicon substrate 101 by a semiconductor process. The active element 102 can be a functional element such as a transistor, an ink jet printer head driving element, an electrophotographic element, or an optical recording element. The active element 102, which, in FIG. 1, is formed only on one side of the {100} silicon substrate 101, may be formed on each side of the substrate. 103 denotes a protective film which is a thermally oxidized film formed a surface of the {100} silicon substrate. 104 denotes a conductive wiring portion extended from the active elements 102. Formed at an end of the wiring portion 104 opposite the end connected to the active element 102 is an external connection electrode 110. 105 designates a through-hole piercing the {100} silicon substrate 101 from the front surface to the rear surface. 106 designates an insulating layer covering the inner surface of the through-hole 105 and portions of the front surface and rear surface of the {100} silicon substrate 101 that are in the vicinity of the through-hole 105. 107 represents a conductive layer formed on the surface of each protective film 103 and on the inner surface of the insulating layer 106. Denoted by 108 is a sealing material which fills up the remaining space inside the through-hole. The conductive layer 107 is electrically connected to the external connection electrode 110. Thus the active element 102 is electrically connected to the rear surface of the {100} silicon substrate 101 via the wiring portion 104, the external connection electrode 110 and the conductive layer 107.

Next, a description is given with reference to FIGS. 2A to 2H on a process of manufacturing the semiconductor device 100 shown in FIG. 1. In FIGS. 2A to 2H, members that are identical to those in FIG. 1 are denoted by the same reference symbols.

A {100} silicon substrate in which an active element is formed in advance is prepared first in FIG. 2A. A reference symbol 109 denotes an insulating protective layer to protect the active element 102 and the wiring portion 104 from contaminations from laser machining, etching, plating or the like which will be described later. The wiring portion 104 is formed on the {100} silicon substrate 101 in advance by a normal semiconductor process. Other semiconductor substrates than a silicon substrate may be employed. Examples of the alternative semiconductor substrates include one whose main ingredient is a single element such as germanium and selenium, one whose main ingredient is a compound such as an oxide, a sulfide, a selenide, a telluride, an antimony compound, an arsenic compound, and a phosphide compound, and one whose main ingredient is an organic semiconductor material.

The {100} silicon substrate 101 has a thickness of 625 µm, and has a wafer shape, a rectangular shape, a polygonal shape, or a complicate shape often used in micromachining or the like. The protective film 103 is a film having electrical insulating properties and etching resistance properties against a TMAH aqueous solution, which will be described later, compared with the {100} silicon substrate 101. The protective film 103 is obtained by depositing an insulating material such as $SiO_2$, SiN or SiO to a thickness of 0.6 µm to 2 µm. The protective layer 109 is a film of an insulating material such as a high polymer, and is formed by spin coating or the like. The thickness of the protective layer 109 is preferably 1 µm to 3 µm, but is not limited to this range. The protective layer 109 can have any thickness as long as it can protect the protective film 103, the active element 102 and the wiring portion 104 against contaminations from laser machining etching, electrodeposition or the like which will be described later, and against electric damage. The external connection electrode 110 has gold, silver, aluminum, copper, silicon or the like as its main ingredient. The external connection electrode 110 is formed such that its surface is not covered by the protective film 103.

Next, in FIG. 2B, the protective film 103 and the protective layer 109 are removed from an area where the through-hole is to be formed on each side of the {100} silicon substrate 101 (hereinafter referred to as opening 111). For the removal, a direct machining method in which the protective film 103 is directly peeled by laser machining can be employed as well as the typical lithography process which includes applying a resist, patterning the resist, and etching the, protective film 103. The opening 111 has a rectangular shape running along boundary lines between {111} crystal planes, which appear while the {100} silicon substrate is etched with a TMAH aqueous solution, and the front surface and rear surface of the {100} silicon substrate. The size of the opening 111 is preferably about 100×100 µm when the through-hole to be formed has a diameter of 30 µm.

Next, in FIG. 2C, a through-hole 105a is formed at the center of the opening 111. Laser machining is employed as a method to form the through-hole 105a. A laser used in laser machining has a wavelength and power high enough to remove the {100} silicon substrate 101, the protective film 103 and the protective layer 109. For example, a solid state laser such as a YAG laser, a YLF laser, a $YVO_4$ laser, a glass laser, or a titanium sapphire laser, a gas laser such as a $CO_2$ laser, a copper vapor laser or an excimer laser, or a dye laser is employable. Laser machining is capable of forming the through-hole 105a perpendicular to each side of the {100} silicon substrate 101 with ease. The inner size of the through-hole 105a is 30 µm.

In FIG. 2D, the {100} silicon substrate 101 is subjected to etching treatment with a TMAH aqueous solution or the like. When a silicon material is etched with a TMAH aqueous solution, the etching rate varies depending on the crystal orientation of silicon. Therefore, as the etching progresses, planes having fast etching rates are etched away until the silicon material obtains an anisotropic shape formed from a plane of slow etching rate. This etching method is called anisotropic etching. The anisotropic etching increases the inner size of the through-hole 105a and thus turns the through-hole 105a into a through-hole 105b. The through-hole 105b has a rectangular shape rotated by 45° with respect to the opening 111. The increase in inner size by etching is ended at a point where the maximum hole size of the through-hole 105b is such that the corners of the rectangular of the through-hole 105b do not protrude outside of the opening 111. In other words, when the opening 111 is a 100×100 µm square, the maximum hole size (diagonal distance) of the through-hole 105b is set to 100 µm or less. Details of the anisotropic etching step shown in FIG. 2D will be described later.

In FIG. 2E, the insulating layer 106 is formed inside the through-hole 105. Liquid deposition is employed as a method of forming the insulating layer 106. Examples of liquid deposition include dipping, dispensing, printing, electrodeposition, and anodization. Liquid deposition does not need to heat a substrate to a high temperature, and therefore is employable for a substrate in which the active element 102 is formed in advance. A material chosen for the insulating layer 106 has to withstand the atmosphere such as temperature in semiconductor processes after this process and chemicals used in the respective processes. The thickness of the insulating layer 106 is preferably 1 μm to 30 μm, but is not limited to this range. The insulating layer 106 can have any thickness as long as the insulating layer 106 shows an insulating performance exceeding a given resistance value in electric insulation between the conductive layer 107, which will be described later, and the {100} silicon substrate 101.

In FIG. 2F, the protective layer 109 formed on each side of the {100} silicon substrate 101 is removed. The entire protective layer 109 is removed at once by oxygen plasma or the like. During the removal of the protective layer 109, the insulating layer 106 formed at the ends of the through-hole is removed partially but not completely because of the difference in thickness. Accordingly, the protective layer 109 remains only under the insulating layer 106 at the ends of the through-hole.

In FIG. 2G, the conductive layer 107 is formed on the surface of the insulating layer 106, which is formed on the inner surface of the through-hole 105b, and on each protective film 103. The conductive layer 107 is formed all over the {100} silicon substrate 101 including the interior of the through-hole 105, and then a given circuit pattern is formed with the conductive layer 107 so that electric conduction is established between the external connection electrode 110 and the front surface and rear surface of the {100} silicon substrate 101 through the inner surface of the through-hole 105b. Copper, nickel, palladium, gold, silver or other similar materials can be used for the conductive layer 107. The thickness of the conductive layer 107 is preferably 0.5 μm to 1.0 μm, but is not limited to this range. The conductive layer 107 can have any thickness as long as the conductive layer 107 provides secure electric conduction from the external connection electrode 110 to the front surface and rear surface of the {100} silicon substrate 101 through the interior of the through-hole 105b and as long as the performance of the conductive layer 107 is such that the circuit resistance value is lower than a given resistance value.

PVD and CVD where the treatment temperature exceeds 1000° C. cannot be used to form the conductive layer 107. What is employable in forming the conductive layer 107 is chosen in accordance with the shape of the through-hole 105 and the aspect ratio from dry plating, wet plating, jet printing, and deposition of conductive paste or molten metal.

Lastly, in FIG. 2H, the interior of the through-hole 105 is completely sealed with the sealing material 108. The sealing material 108 is resin, molten metal or the like. Examples of an employable filling method include printing, injection, and a method of utilizing the difference in air pressure between the interior and exterior of the through-hole.

The description given next with reference to FIGS. 3A to 3D is about details of the anisotropic etching step, which has been described above referring to FIG. 2D. FIGS. 3A to 3D are schematic sectional views showing how the through-hole 105a formed in FIG. 2C to have an inner size of 30 μm is etched by anisotropic etching. The drawings show changes in shape of the through-hole with time from 0 minute to 70 minutes after the etching is started. The etching conditions include employing a 20% aqueous solution of TMAH and setting the etchant temperature to 80°.

FIG. 3A is a top view and sectional view of the {100} silicon substrate 101 immediately after the etching is started (0 minute). In FIG. 3A, the protective film 103 and the protective layer 109 are formed and the opening 111 is opened on each side of the {100} silicon substrate 101. The opening 111 has a rectangular shape running along boundary lines between {111} crystal planes, which appear while the {100} silicon substrate is etched with a TMAH aqueous solution, and the front surface and rear surface of the {100} silicon substrate. The through-hole 105a has been formed by laser machining at the center of the opening 111 to have an inner size of 30 μm. The through-hole 105 at this point is perpendicular to the {100} silicon substrate 101.

Figure 3B:
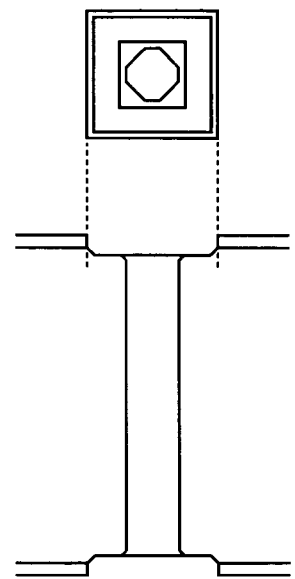
Figure 4:
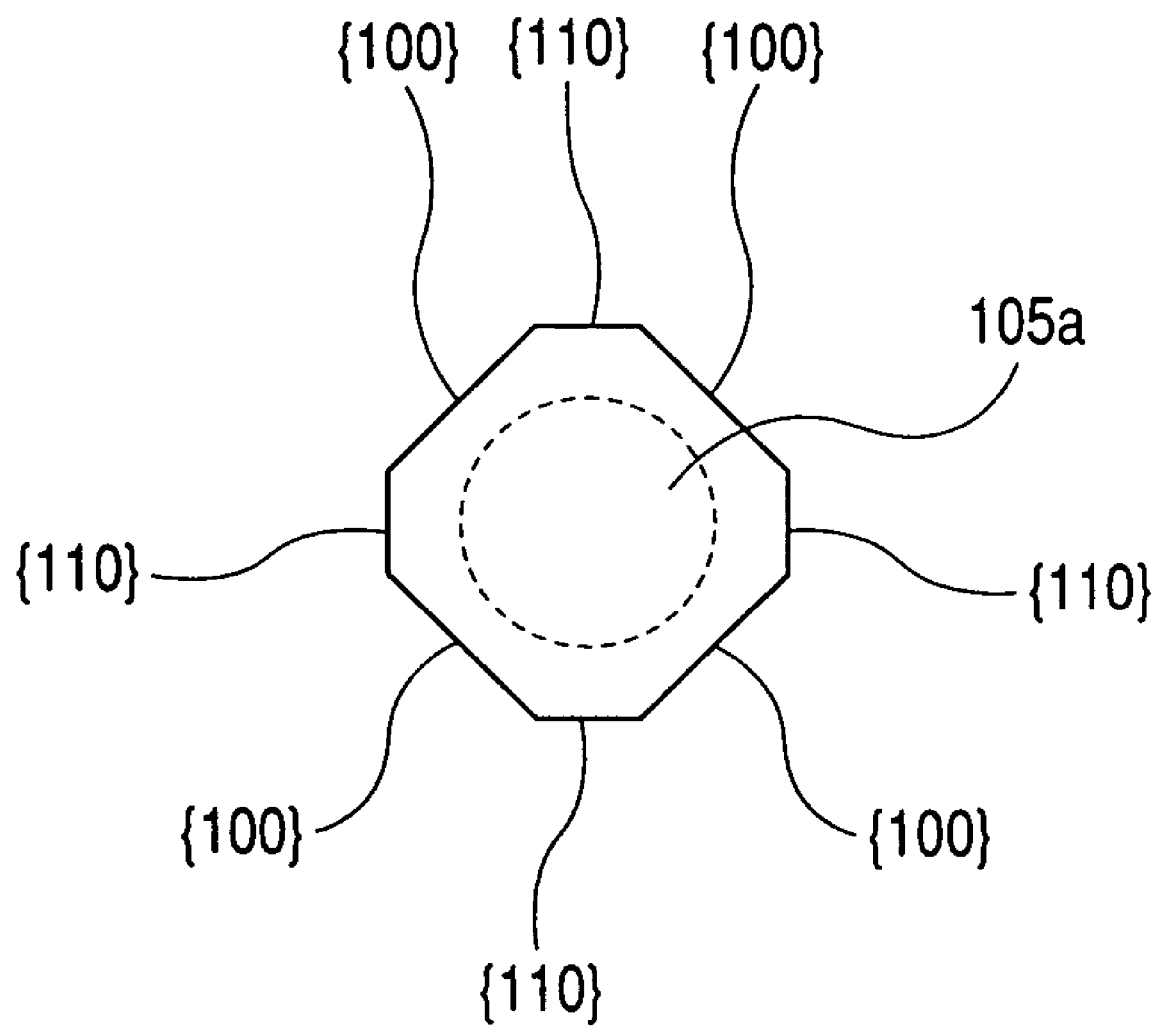
FIG. 4 is a schematic diagram showing the relation between a {100} crystal plane and a {110} crystal plane on the inner surface of the through-hole.

FIG. 3B is a top view and sectional view of the {100} silicon substrate 101 20 minutes past the start of the etching. The through-hole 105b at this point has an octagonal shape formed from {100} and {110} crystal planes. FIG. 4 is a schematic diagram showing in cross section of the through-hole 105a at this point, and indicates the relation between the {100} and {110} crystal planes on the inner surface of the through-hole 105a. The distance between opposite sides of the octagonal shape is 50 μm. The octagonal shape is formed as Si in the through-hole is melted by anisotropic etching in a manner that makes the {100} and {110} crystal planes appear alternatingly.

Figure 5A:
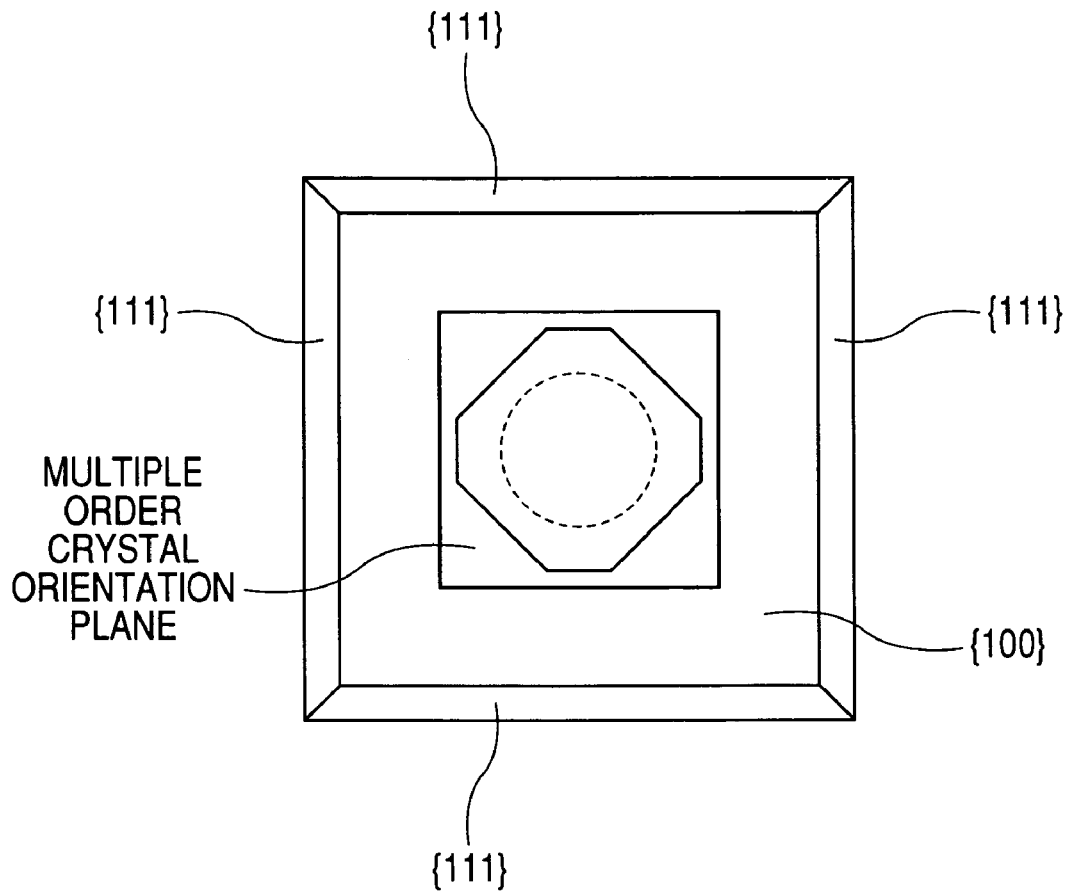
FIGS. 5A and 5B are schematic diagrams showing the relation between a {100} crystal plane and a multiple order crystal orientation of a {110} crystal plane on the inner surface of the through-hole.
Figure 5B:
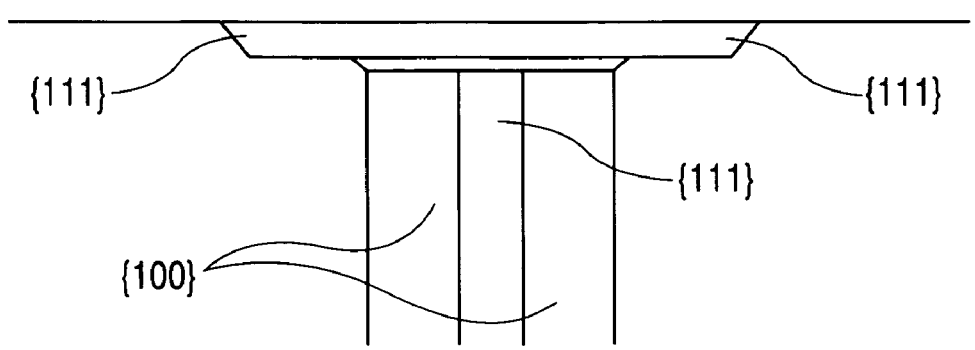

At this point, {100} crystal planes and {111} crystal planes appear at the bottom of the opening 111 on each side of the {100} silicon substrate 101, and plural crystal planes of multiple order crystal orientation appear in boundaries between the through-hole 105b and the front surface and rear surface of the {100} silicon substrate 101. FIGS. 5A and 5B are schematic diagrams showing the through-hole 105b in the vicinity of the opening at this point. FIG. 5A is a top view showing crystal planes on the top of the through-hole and FIG. 5B is a sectional view thereof.

Figure 9A:
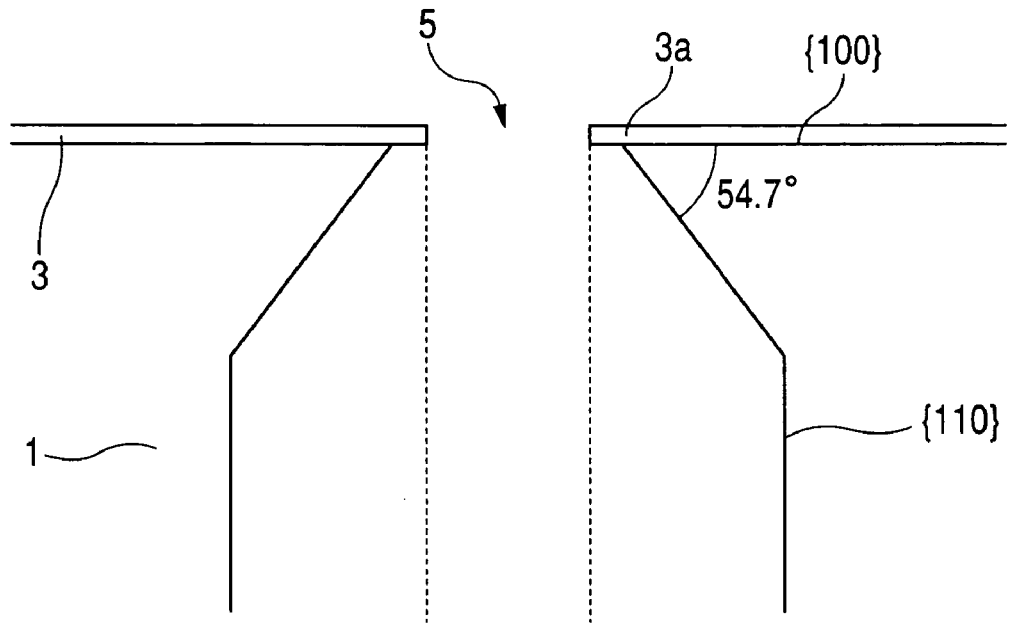
FIGS. 9A and 9B are sectional views of a semiconductor substrate in which a conventional through-hole is formed.
Figure 9B:
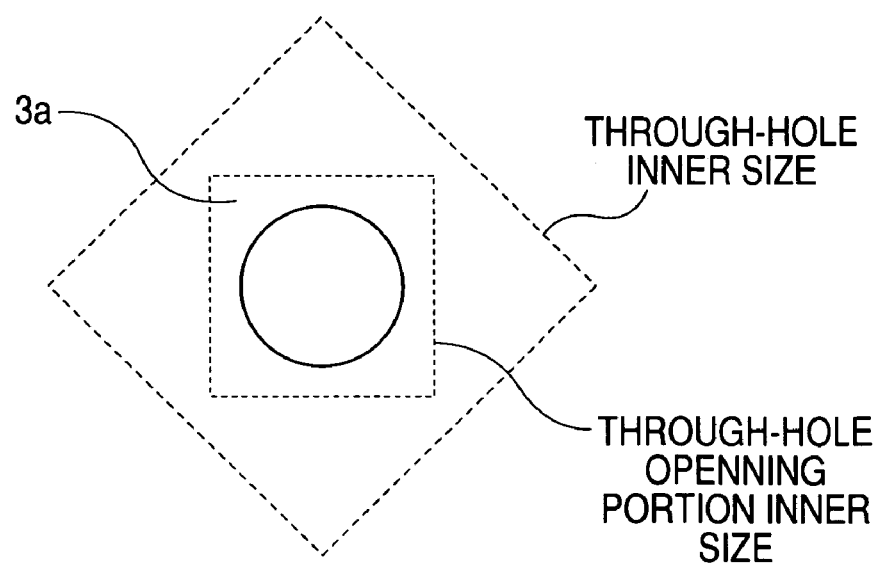

In FIGS. 5A and 5B, the inner surface of the through-hole 105b formed by laser machining is melted immediately after the start of the etching, and {100} and {110} crystal planes appear as shown in FIG. 4. At this point, the {100} crystal planes on the front surface and rear surface of the {100} silicon substrate 101 are exposed in the opening 111 formed around the through-hole 105b. Therefore, the etching progresses in the opening 111 in the direction of the thickness of the {100} silicon substrate 101. Near the boundaries between the through-hole 105b and the front surface and rear surface of the {100} silicon substrate 101, multiple order crystal planes that are etched at a rate faster than the {100}, {110} and {111} crystal planes always appear and silicon is repeatedly dissolved. Therefore, immediately after the inner size of the through-hole 105b starts to be increased by etching, {111} crystal planes do not appear in a reverse taper direction as shown in FIGS. 9A and 9B and the shape of the through-hole 105b is not tapered reversely.

Figure 3C:
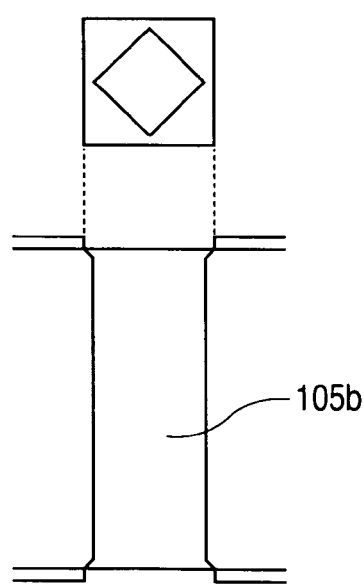

FIG. 3C is a top view and sectional view of the {100} silicon substrate 101 40 minutes past the start of the etching. The through-hole 105b at this point is surrounded by {100} crystal planes and has a rectangular shape that is slanted at 45° with respect to the opening 111. The distance between opposite sides of the through-hole 105b is about 75 μm. Under the etching conditions of the silicon substrate, the etching rate in the {110} crystal orientation is about twice faster than the etching rate in the {100} crystal orientation as shown in Table 1. Accordingly, the octagonal through-hole 105b of FIG. 3B loses the {110} crystal-planes on its inner surface as time elapses, and only left with the {100} crystal planes. The through-hole forms the rectangular shape with the remaining {100} crystal planes. The through-hole 105b at this point is perpendicular to the {100} silicon substrate 101. The best relation between the through-hole 105b and the opening 111 is that a diagonal line of the rectangular through-hole 105b is substantially equal in length to one side of the rectangular opening 111. Then, the through-hole 105b can have the maximum hole size that does not give the through-hole 105b a reversely tapered shape.

Figure 3D:
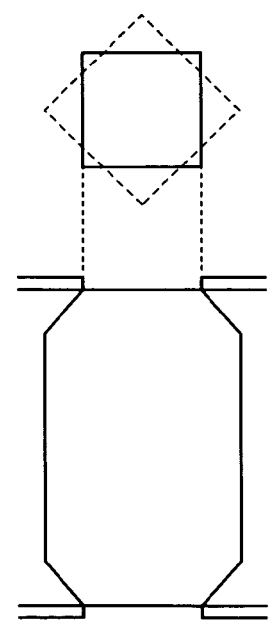
Figure 6A:
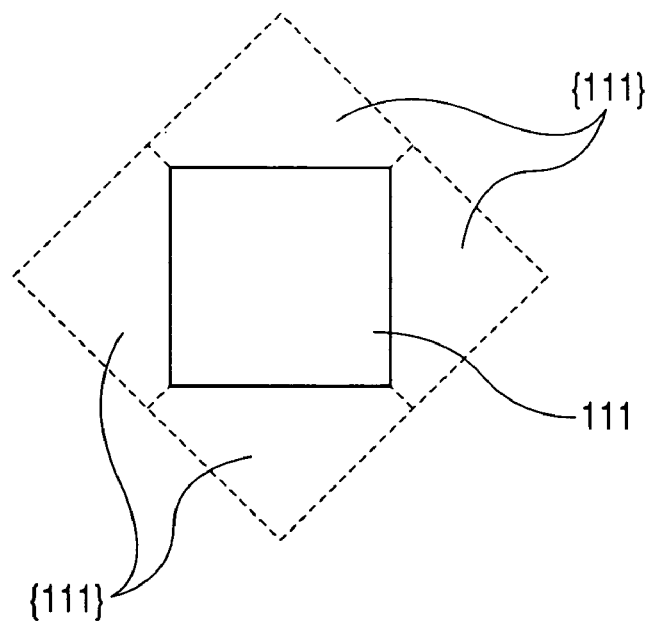
FIGS. 6A and 6B are diagrams showing crystal planes at an opening and on the top of the through-hole.
Figure 6B:
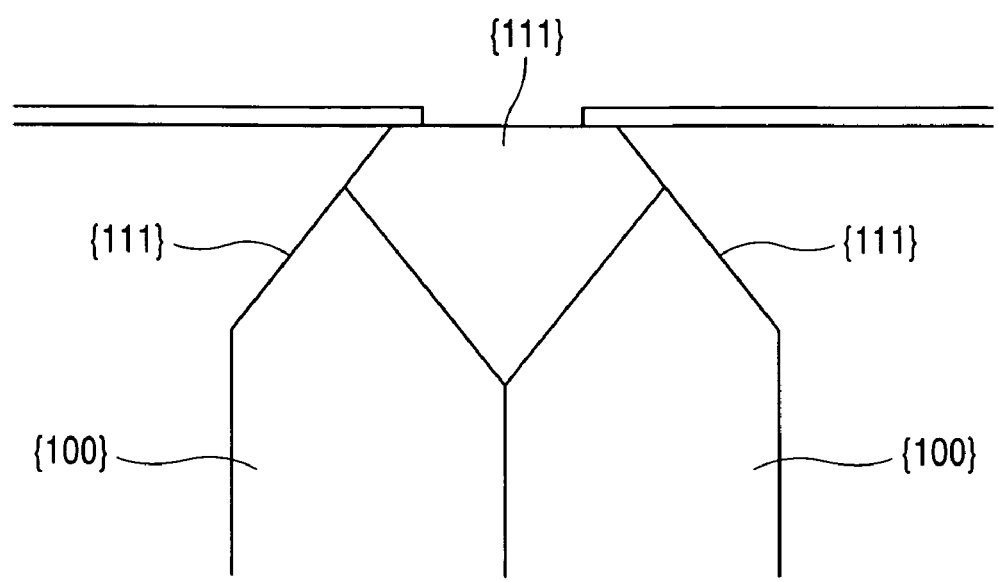

FIG. 3D is a top view and sectional view of the {100} silicon substrate 101 70 minutes past the start of the etching. The through-hole 105b at this point has a reversely tapered shape and the inner size is partially larger than the opening 111. FIGS. 6A and 6B are schematic diagrams showing the concept of the reversely tapered shape. Shown in FIGS. 6A and 6B is the state of the through-hole 105b in which its inner size completely exceeds the opening 111 by further etching the through-hole 105b in the state shown in FIG. 3D.

FIG. 6A is a top view of the through-hole 105b and shows the state of the crystal planes at this point. FIG. 6B is a sectional view of the through-hole 105b at this point. In FIGS. 6A and 6B, as a result of the increase in inner size of the through-hole 105b by etching, the inner size of the through-hole 105b has exceeded the opening 111 and every {100} crystal plane on the front surface and rear surface of the {100} silicon substrate 101 has been etched away. Therefore, no multiple order crystal plane appears around the through-hole 105b and the etching rate in the direction of the thickness of the {100} silicon substrate 101 is nearly 0. This causes {111} crystal planes to appear from about the surface of the through-hole 105b in the reverse taper direction. This through-hole shape is one that lowers the reliability of the step as described in the Related Background Art section, meaning that the optimum etching time has passed.

Figure 7:
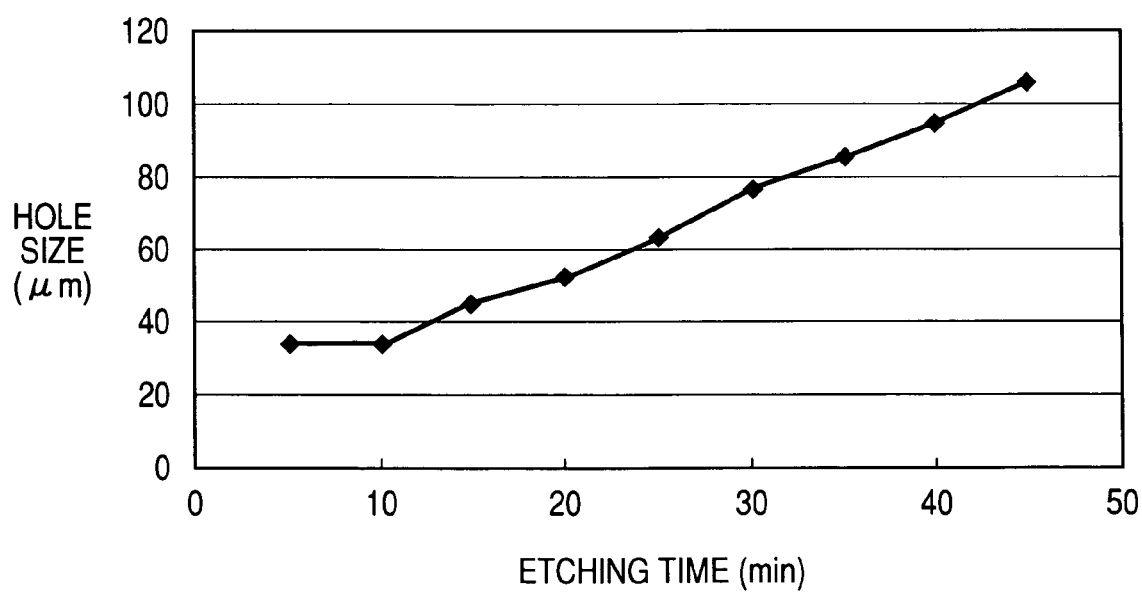
FIG. 7 is an etching rate graph in anisotropic etching.
Figure 8A:
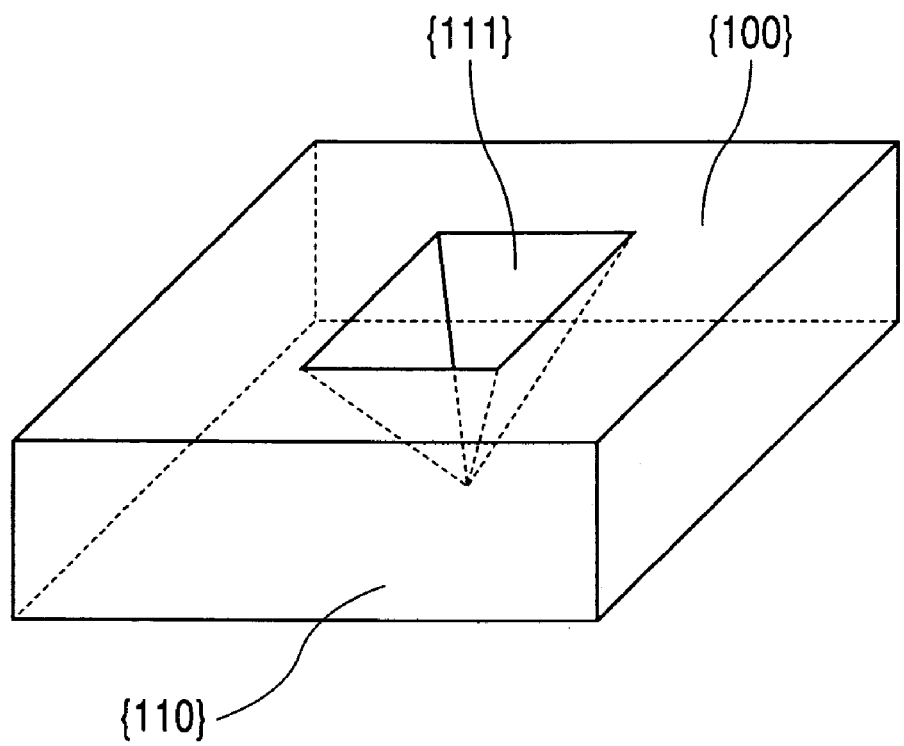
FIGS. 8A and 8B are schematic diagrams showing the positional relation between crystal planes in a {100} silicon substrate.
Figure 8B:
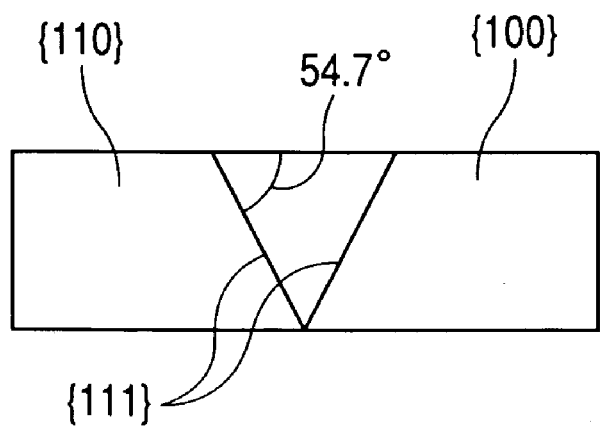

FIG. 7 is a graph showing the relation between the etching time and the hole size of the through-hole (the distance between corners of the rectangular) which has been described with reference to FIGS. 3A to 3D. The shape of FIG. 3C is obtained when the etching time is 40 to 45 minutes. The 40 to 45-minute etching time is therefore an etching condition under which the maximum hole size is obtained while avoiding appearance of reversely tapered {111} crystal planes, which lower the reliability of the step. Furthermore, the etching for 40 to 45 minutes eliminates molten pieces of a semiconductor such as machining residue, for example, dross, debris or the like caused by laser machining, as well as cracks, crystal defects and so on, giving the through-hole a very smooth wall surface entirely composed of the appeared {100} crystal planes. This brings the through-hole to a state optimum for formation of the insulating layer and the conductive layer which will be described later.

Through the above manufacturing process, a circuit pattern can be formed from the external connection electrode 110 via the through-hole 105 to the rear surface of the {100} silicon substrate 101, and an electrode structure can be obtained which is capable of picking up signals of the active element 102 on the rear surface of the {100} silicon substrate 101.

The present invention makes it possible to quickly form a through-hole that is substantially perpendicular to a semiconductor substrate having a surface of a {100} crystal plane orientation. Thus deposition quality by CVD, PVD or the like, the plating quality, and the hole sealing quality are improved and the reliability of the process is ensured.

In addition, since a through-hole is once formed by laser machining and then its inner size is increased by anisotropic etching, dross, debris or the like produced around and inside the laser machined hole is eliminated and a high-quality through-hole can be obtained whose inner surface is made from very smooth crystal planes.

Another effect of the present invention is that the step of removing a hood is omitted since there is no hood of an etching stopper film such as a thermally oxidized film and the like as at the openings in the front surface and rear surface of the semiconductor substrate.

This application claims priority from Japanese Patent Application No. 2004-154836 filed May 25, 2004 and Japanese Patent Application No. 2005-141086, filed May 13, 2005 which are hereby incorporated by reference herein.

What is claimed is:

1. A semiconductor device with a through-hole electrically connecting a front surface and a rear surface, comprising:

a semiconductor substrate having a surface of a {100} crystal plane orientation;

a protective film formed on the surface of the semiconductor substrate, the protective film having an opening where the semiconductor substrate is partially exposed; and a through-hole formed inside the opening to have an inner size smaller than that of the opening, wherein the through-hole has a tapered shape in a direction where its inner size becomes smaller near the opening, wherein an insulating layer is formed on an inner surface of the through-hole and a conductive layer is formed on an inner surface of the insulating layer, and wherein the conductive layer electrically connects the front surface and rear surface of the semiconductor substrate.

2. A semiconductor device according to claim 1, wherein the inner size of the through-hole is nearly equal to that of the protective-film-removed portion, and wherein the through-hole is perpendicular to the semiconductor substrate.

3. A semiconductor device according to claim 1, wherein a profile of the through-hole and a profile of the opening are each rectangular and intersect each other at right angles, and wherein a length of a diagonal line of a horizontal section of the through-hole becomes nearly equal to a length of a side of a region on which the protective film is removed.

* * * * *